United States Patent [19]

Anzai et al.

[11] Patent Number: 4,871,237
[45] Date of Patent: Oct. 3, 1989

[54] METHOD AND APPARATUS FOR ADJUSTING IMAGING PERFORMANCE OF PROJECTION OPTICAL APPARATUS

[75] Inventors: Satoru Anzai, Zama; Koichi Ohno, Inagi, both of Japan

[73] Assignee: Nikon Corporation, Tokyo, Japan

[21] Appl. No.: 120,232

[22] Filed: Nov. 12, 1987

Related U.S. Application Data

[63] Continuation of Ser. No. 4,775, Jan. 9, 1987, abandoned, which is a continuation of Ser. No. 632,335, Jul. 19, 1984, abandoned.

[30] Foreign Application Priority Data

Jul. 27, 1983 [JP] Japan .................................. 58-137377
Oct. 5, 1983 [JP] Japan .................................. 58-186269
Dec. 26, 1983 [JP] Japan .................................. 58-249093

[51] Int. Cl.$^4$ .......................... G02B 1/06; G02B 7/10
[52] U.S. Cl. ...................................... 350/419; 350/413
[58] Field of Search ............................... 350/419, 413

[56] References Cited

U.S. PATENT DOCUMENTS

| 3,498,695 | 3/1970 | Brouwer | 350/179 |
| 3,528,727 | 9/1970 | Halliday | 350/413 |
| 4,331,388 | 5/1982 | McCrobie et al. | 350/419 |

OTHER PUBLICATIONS

Rees, "Technique for Varying Focal Length of a Lens", *Xerox Disclosure Journal*, vol. 1, Nos. 11/12, 11/12-76, pp. 61-62.

Primary Examiner—Bruce Y. Arnold
Assistant Examiner—Rebecca D. Gass
Attorney, Agent, or Firm—Shapiro and Shapiro

[57] ABSTRACT

In a method and apparatus for highly precisely adjusting the optical performance including the imaging plane and the magnification factor of a projection lens in a projection optical apparatus, adjustment of the projection lens is achieved by changing the barometric pressure, i.e., the refractive index of at least one space which is located on an optical path and which is shielded from the outer atmosphere is changed by changing the barometric pressure therein. At this space, a space or gap present between any two adjacent elements of a plurality of lens elements or a group of lenses constituting a projection lens is preferably selected. The selected space is independent from and is shielded from the outer atmosphere by the lenses defining itself and a housing supporting these lenses, and is filled with air or a gas. The pressure of the air or gas inside the independent space is controlled by a barometric controller.

19 Claims, 5 Drawing Sheets

METHOD AND APPARATUS FOR ADJUSTING IMAGING PERFORMANCE OF PROJECTION OPTICAL APPARATUS

This is a continuation application of Serial No. 004,775 filed Jan. 9, 1987, which is a continuation application of Serial No. 632,335 filed Jul. 19, 1984, both of which are now abandoned.

BACKGROUND OF THE INVENTION

1. Field of the Invention

The present invention relates to a method and apparatus for adjusting the performance of an optical system in a projection optical apparatus and, more particularly, to a method and apparatus for highly precisely adjusting the imaging performance of a projection optical apparatus which is used to project a micropattern formed on a photomask or a reticle onto a semiconductor wafer.

2. Description of the Prior Art

A projection exposure apparatus using a projection lens can provide high alignment and matching precision and is therefore making a great contribution to the fabrication of VLSIs. A projection exposure apparatus of this type projects an image of a pattern on the photomask or the reticle onto the wafer coated with a photoresist at a predetermined factor by means of a projection lens. An important factor in the performance of the exposure apparatus is the matching precision. The most important factor influencing the matching precision is a magnification factor error of the projection optical system. The size of patterns used for the manufacture of VLSIs is becoming increasingly micronized these days, and demand for improvements in the matching precision is also strong. For this reason, it is more than ever important to keep the projection magnification factor at a predetermined value. With a projection optical apparatus available today, the magnification factor of the optical system is adjusted during installation of the apparatus so that the error in the magnification factor is kept negligible. However, in order to respond to the need for higher integration of VLSIs, any errors in the magnification factor of the projection optical system which arise from even the slightest changes in the barometric pressure or other environmental factors in a clean room having the apparatus installed must be corrected. A change in the magnification factor which arises due to a temperature change in the projection lens upon absorption of exposure energy must also be corrected. However, in general, when the magnification factor of the optical system is changed due to changes in environmental factors such as a change in barometric pressure or an increase in the temperature of the projection lens, the position of the imaging plane is also changed. A projection objective lens for which a high resolution is required has a large N.A. (numerical aperture) and a short focal depth. Therefore, even a slightest change in the position of the imaging plane must be corrected satisfactorily.

In order to change the projection magnification factor of the projection optical system, methods have been conventionally adopted wherein the distance between an object or an image surface and the projection lens is mechanically changed or the lens elements of the projection lens are moved along its optical axis. However, with the conventional method of mechanically moving the optical elements, when highly precise setting of the magnification factor and of imaging plane are required, the eccentricity (shift, tilt) of the movable portion prevents the optical axis from being kept constant. Therefore, the optical axis of the optical system including the object cannot be aligned on a single line, so that a magnification factor distribution which is asymmetrical with respect to the ideal optical axis is generated on the image surface. In order to set the magnification factor with a high precision such that an error within only 0.05 $\mu$m or less is generated, the displacement of the optical elements must be controlled to be less than 1 $\mu$m or at most several micrometers including the eccentricity (shift, tilt). However, such control involves extreme difficulties.

SUMMARY OF THE INVENTION

It is a principal object of the present invention to provide a method and apparatus for highly precisely adjusting the optical performance including the imaging plane and the magnification factor of a projection lens in a projection optical apparatus.

In accordance with the present invention, adjustment of the projection lens is achieved by changing the barometric pressure, i.e., the refractive index of at least one space which is located on an optical path and which is shielded from the outer atmosphere is changed by changing the barometric pressure therein. As this space, a space or gap present between any two adjacent elements of a plurality of lens elements or a group of lenses constituting a projection lens is preferably selected. The selected space is independent from and is shielded from the outer atmosphere by the lenses defining itself and a housing supporting these lenses, and is filled with air or a gas. The pressure of the air or gas inside the independent space is controlled by a barometric controller.

In accordance with an aspect of the present invention, at least two of a plurality of spaces defined between each two adjacent lenses of a plurality of lenses constituting a lens system are formed as independent air chambers. These independent air chambers are coupled through a communication hole or a tube so as to allow simultaneous control of the barometric pressures therein. When two spaces are selected as two such independent air spaces wherein the directions of changes in the position of the imaging plane with respect to changes in barometric pressures therein are opposite to each other and the barometric pressures therein are controlled accordingly, the magnification factor alone can be adjusted while the imaging plane is kept fixed in position. On the other hand, when two spaces are selected as two such independent air spaces wherein the directions of changes in magnification factor with respect to changes in the barometric pressures therein are opposite to each other and the barometric pressures therein are controlled accordingly, the imaging plane alone can be adjusted while the magnification factor is kept constant.

If changes in both magnification factor and imaging plane position can be cancelled by a suitable combination of a plurality of air chambers, specific aberrations such as spherical aberration, coma, curvature of field, or distortion can each be corrected independently of the other aberrations.

Even with a projection lens which is ideally adjusted in various optical properties, the magnification factor and/or imaging plane position slightly change due to external factors disturbing the adjustments, such as a change in barometric pressure or a temperature increase of the lens itself. According to a preferred embodiment of the present invention, one or a plurality of spaces are selected wherein the ratio of the amount of change in the magnification factor to that in the position of the imaging plane which arises from barometric pressure control is substantially equal to the same ratio corresponding to one external factor.

DESCRIPTION OF PREFERRED EMBODIMENTS

Figure 1:
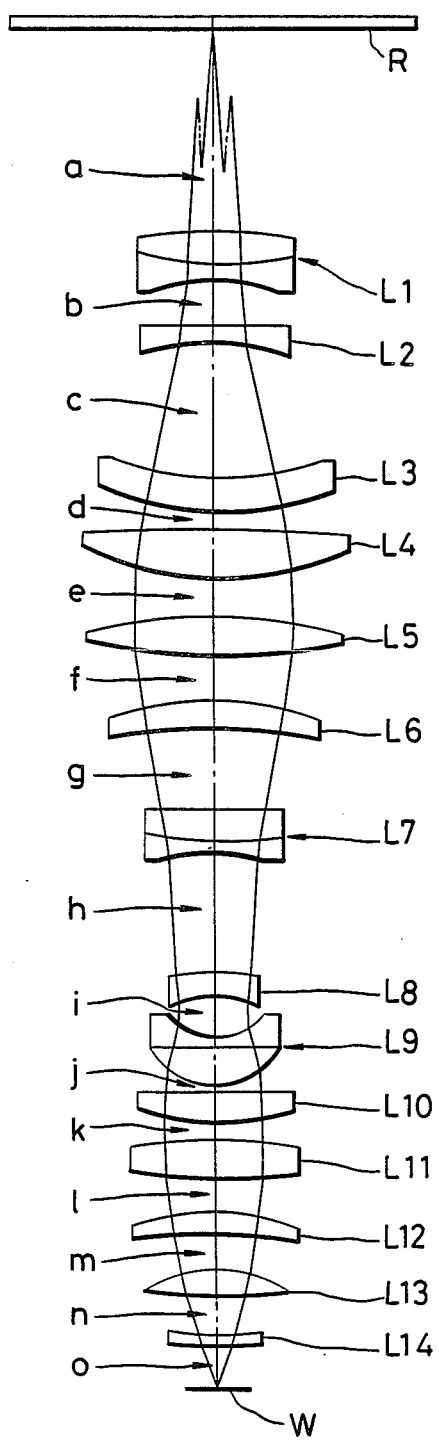
FIG. 1 is a diagram showing the arrangement of a projection lens according to which the present invention may be applied.

FIG. 1 shows a projection lens which can be used in a projection exposure apparatus according to the present invention. The projection lens projects in a reduced size a predetermined pattern on a reticle R onto a wafer W. In FIG. 1, light rays are shown which represent the conjugate relationship of the object point on the optical axis between the wafer W and the reticle R. The projection lens has a total of 14 lenses L1 to L14 sequentially arranged from the side of the reticle R and a total of 15 spaces a to o sequentially defined between the reticle R, the lenses L1 to L14 and the wafer W from the side of the reticle R. Table 1 below shows various specifications of this projection lens. However, note that in Table 1 symbol r denotes the radius of curvature of each lens surface; D, the central thickness and air gap of each lens; N, the refractive index of each lens for light of i-line having a wavelength $\lambda = 365.0$ nm; D0, the distance between the reticle R and the frontmost lens surface; and D31, the distance between the last lens surface and the wafer W. Note also that in Table 1 the numbers at the left column represent the order from the reticle R.

When the barometric pressures in the respective spaces a and o of the above projection lens are changed by +137.5 mmHg, respectively, the relative refractive index of each space changes to 1,00005. The change $\Delta X$ in magnification factor and change $\Delta Z$ in the position of the imaging plane or conjugate plane with the reticle R become as shown in Table 2 below. The change $\Delta X$ in magnification factor is presented by the amount of displacement ($\mu$m) of an image point at a distance of 5.66 mm from the optical axis after the barometric pressure in each space is changed when the pressure at the imaging plane is kept constant. The change $\Delta X$ in magnification factor when an enlarged pattern is projected on the imaging plane under no barometric pressure change, that is, on a predetermined wafer surface is represented by the positive sign. The change $\Delta Z$ in the position of the imaging plane is represented by the changes in the position of the imaging point on the optical axis ($\mu$m), and the change when the imaging plane is moved away from the projection lens is represented by the positive sign. Both changes $\Delta X$ and $\Delta Z$ are therefore represented in units of $\mu$m.

TABLE 1

| No. | r | D | N | | |
|---|---|---|---|---|---|
| | | $D_0 = 259.78958$ | 1.000000 | | a |
| 1 | 143.86900 | 9.97570 | 1.504150 | $\Big\}$ $L_1$ | |
| 2 | −81.46300 | 3.42920 | 1.602500 | | |
| 3 | 51.49700 | 14.02840 | 1.000000 | | b |
| 4 | 540.12700 | 4.98790 | 1.602500 | $L_2$ | |
| 5 | 62.56200 | 41.77340 | 1.000000 | | c |
| 6 | −68.02600 | 9.66400 | 1.562260 | $L_3$ | |
| 7 | −74.29500 | 4.05260 | 1.000000 | | d |
| 8 | 1355.17400 | 15.58710 | 1.504150 | $L_4$ | |
| 9 | −73.55600 | 10.28750 | 1.000000 | | e |
| 10 | 135.96800 | 10.59920 | 1.536390 | $L_5$ | |
| 11 | −200.04700 | 13.09320 | 1.000000 | | f |
| 12 | 81.78000 | 9.35230 | 1.562260 | $L_6$ | |
| 13 | 160.24400 | 24.00410 | 1.000000 | | g |
| 14 | −463.01200 | 9.66400 | 1.536390 | $\Big\}$ $L_7$ | |
| 15 | −146.45400 | 2.80570 | 1.602500 | | |
| 16 | 64.24100 | 34.91510 | 1.000000 | | h |
| 17 | 49.49500 | 8.41700 | 1.627530 | $L_8$ | |
| 18 | 30.04000 | 11.22270 | 1.000000 | | i |
| 19 | −16.99700 | 2.49390 | 1.602500 | $\Big\}$ $L_9$ | |
| 20 | 351.55900 | 11.53450 | 1.504150 | | |
| 21 | −22.57200 | 1.24700 | 1.000000 | | j |
| 22 | −654.15900 | 9.97570 | 1.504150 | $L_{10}$ | |
| 23 | −74.32800 | 4.75150 | 1.000000 | | k |
| 24 | 153.24500 | 11.53450 | 1.536390 | $L_{11}$ | |
| 25 | −275.84600 | 8.72880 | 1.000000 | | l |
| 26 | 50.46800 | 7.17010 | 1.562260 | $L_{12}$ | |
| 27 | 144.70600 | 10.91100 | 1.000000 | | m |
| 28 | 41.10500 | 7.27400 | 1.562260 | $L_{13}$ | |
| 29 | −387.53000 | 11.22270 | 1.000000 | | n |
| 30 | −95.33700 | 3.11740 | 1.627530 | $L_{14}$ | |
| 31 | −291.36200 | | 1.000000 | | o |
| | | $D_{31} = 12.46970$ | | | |

TABLE 2

| Space number | | $\Delta X$ ($\mu$m) | $\Delta Z$ ($\mu$m) |
|---|---|---|---|
| 1 | a | +0.031 | +0.37 |
| 2 | b | +0.038 | −0.49 |
| 3 | c | +1.164 | −2.47 |
| 4 | d | −1.173 | +3.05 |
| 5 | e | −2.086 | +5.65 |
| 6 | f | −1.388 | +4.19 |
| 7 | g | +0.194 | −0.93 |
| 8 | h | +0.131 | −0.03 |
| 9 | i | +0.116 | −4.80 |
| 10 | j | +0.143 | +4.04 |
| 11 | k | +0.127 | +2.06 |
| 12 | l | +0.224 | +2.06 |
| 13 | m | +0.136 | +0.89 |
| 14 | n | −0.008 | +0.62 |
| 15 | o | +0.012 | +0.65 |
| Entire system | | +1.004 | +14.83 |

In general, the relationship between the changes in barometric pressure in the space and changes in magnification changes varies in accordance with the projection magnification factor and the type of the lens used. Furthermore, even with a single lens, this relationship changes in accordance with the position of a space in which the barometric pressure is changed. When the barometric pressure inside a space changes, not only the magnification factor but also the position of the imaging plane is changed. However, the degree of such an influence also changes from one space to another.

Assume a case wherein one of the spaces defined between every two adjacent lenses of the projection lens is constituted as an air chamber shielded from the outer atmosphere. Assuming that the barometric pressure inside this air chamber changes by a unit pressure from the initial magnification factor setting time, the amount of change in the magnification factor, that is, the amount of displacement of the image point on a predetermined axis on the imaging plane will be represented by $\Delta X_1$. It is also assumed that the pressure in any chamber other than the air chamber changes at a rate substantially the same as that of the outer atmosphere, and the amount of change in magnification factor for the overall projection lens excluding the air chamber upon a unit change in
pressure of the outer atmosphere will be represented by $\Delta X$. When the change in the barometric pressure of the outer atmosphere is represented by
$\Delta P$, the change in magnification factor $\Delta X$ can be
corrected by changing the pressure in the air chamber by $\Delta P_1$ and so satisfying the following relation:

$$\Delta P_1 \cdot \Delta X_1 + \Delta P \cdot \Delta X = 0 \tag{1-1}$$

However, even if such barometric control in one air chamber allows correction of the magnification factor of the projection lens, it does not allow simultaneous correction of changes in the position of the imaging plane. In view of this, it is preferable to form a second air chamber which is also shielded from the outer atmosphere. In this case, the amount of change in the position of the imaging plane for a unit change in pressure in the first air chamber is represented by $\Delta Z_1$, the amount of change in the position of the imaging plane for a unit change in pressure in the second air chamber is represented by $\Delta Z_2$, the amount of change in the magnification factor of the projection lens for a unit change in pressure in the first air chamber is represented by $\Delta X_1$, and the amount of change in the magnification factor of the projection lens for a unit change in pressure in the second air chamber is represented by $\Delta X_2$. When the pressure in the first air chamber is changed by $\Delta P_1$ and that in the second air chamber is changed by $\Delta P_2$ so as to satisfy the following equations:

$$\Delta P_1 \cdot \Delta X_1 + \Delta P_2 \cdot \Delta X_2 + \Delta P \cdot \Delta X = 0$$

$$66\ P_1 \cdot \Delta Z_1 + \Delta P_2 \cdot \Delta Z_2 + \Delta P \cdot \Delta Z = 0 \tag{1-2}$$

the changes in both the magnification factor and the position of the imaging plane arising from all the remaining spaces can be easily corrected.

According to a first embodiment of the present invention, an 8th space h is used as an air chamber for correcting the magnification factor and a 14th space n is used as an air chamber for correcting the position of the imaging plane. The selection of the air chambers in this case is based on the fact that, referring to Table 2 above, the change in the position of the imaging plane is minimum in the 8th space h and the change in magnification factor is minimum in the 14th space n. The spaces other than the 8th space h and the 14th space n are not shielded from the outer atmosphere and therefore pressures in these chambers change together with that of the outer atmosphere. As a condition for correcting changes in magnification factor and the position of the imaging plane for a change in the pressure of the outer atmosphere, the equations (1-2) can be rewritten as:

$$\Delta Ph \cdot \Delta Xh + \Delta Pn \cdot \Delta Xn + \Delta P \cdot \Delta X = 0$$

$$\Delta Ph \cdot \Delta Zh + \Delta Pn \cdot \Delta Zn + \Delta P \cdot \Delta Z = 0 \tag{1-3}$$

where $\Delta Ph$ is the amount of change in the pressure in the 8th space h, $\Delta Xh$ is the amount of change in magnification factor for a unit pressure change in the 8th space h, $\Delta Zh$ is the amount of change in the position of the imaging plane for a unit pressure change in the 8th space h, $\Delta Pn$ is the amount of change in the pressure of the 14th space n, $\Delta Xn$ is the change in the magnification factor for a unit pressure change in the 14th space n, and $\Delta Zn$ is the amount of change in the position of the imaging plane for a unit pressure change in the 14th space n.

Table 2 shows the changes in the magnification factor and in the position of the imaging plane when the change in pressure in each space is $+137.5$ mmHg. When the values of $\Delta Xh$, $\Delta Xn$, $\Delta X$, $\Delta Zh$, $\Delta Zn$, and $\Delta Z$ are substituted in the equations (1-3), the equations (1-3) may be rewritten as follows:

$$9.53 \times 10^{-4} \times \Delta Ph - 5.82 \times 10^{-5} \times \Delta Pn \tag{1-4}$$

$$+ 6.41 \times 10^{-3} \times \Delta P = 0$$

$$- 2.19 \times 10^{-4} \times \Delta Ph + 4.51 \times 10^{-3} \times \Delta Pn$$

$$+ 1.04 \times 10^{-1} \times \Delta P = 0$$

When the equations (1-4) are solved for $\Delta Ph$ and $\Delta Pn$, we have:

$$\Delta Ph = -8.2\Delta P,\ \Delta Pn = -23.5\Delta P$$

Taking an example, when the change in the barometric pressure of the outer atmosphere is $-10$ mmHg, if the pressure of the 8th space h is increased by 8.2 mmHg and that in the 14th space n is increased by 235 mmHg, the changes in both the magnification factor and position of the imaging plane arising from the changes in barometric pressure in the outer atmosphere can be corrected.

Figure 2:
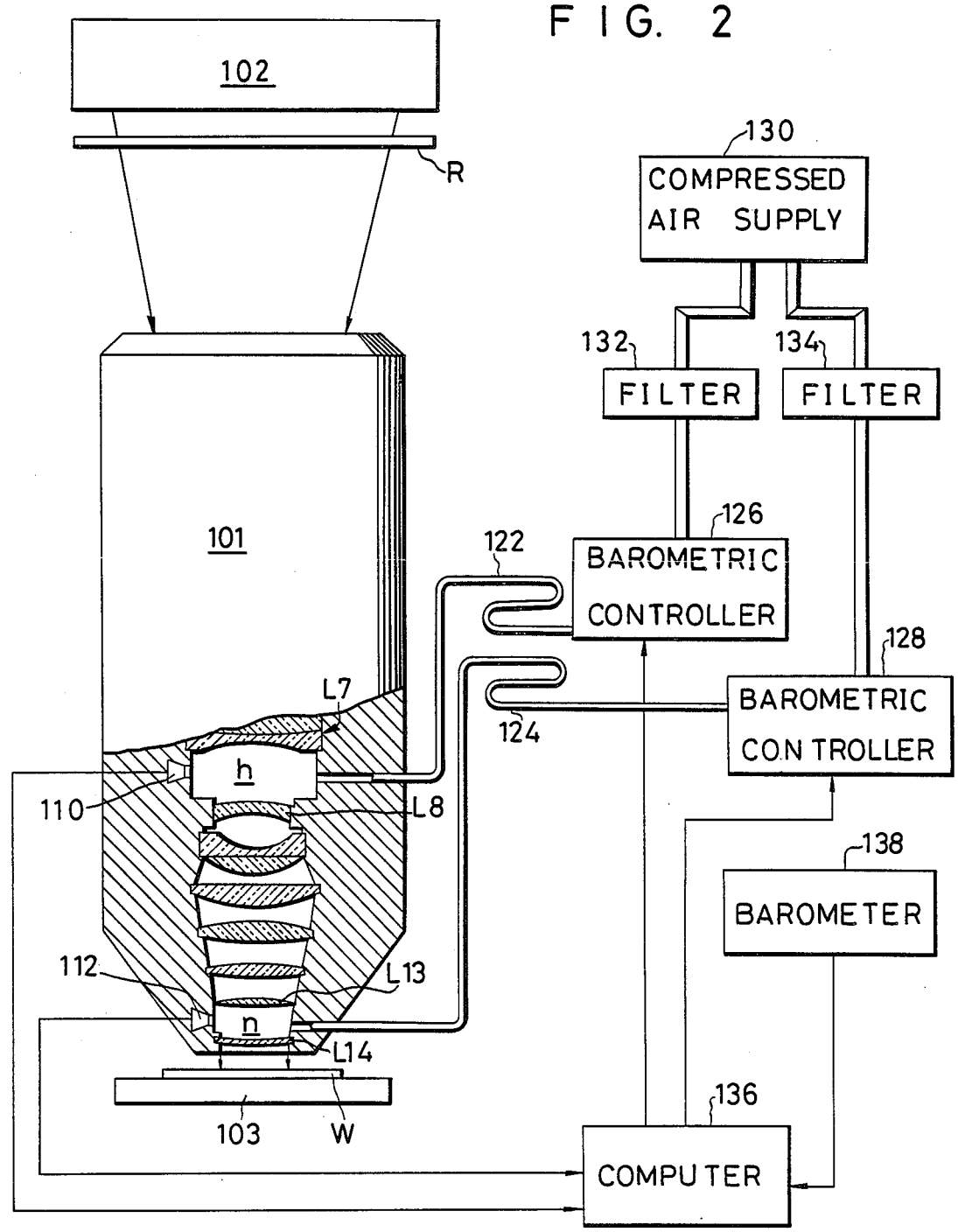
FIG. 2 is a partially sectional view of a projection exposure apparatus according to a first embodiment of the present invention which has the projection lens shown in FIG. 1 and barometric controllers.

FIG. 2 shows a projection optical apparatus which has barometric controllers capable of performing pressure control of air chambers in accordance with the principle described above. A housing 101 houses the projection lens shown in FIG. 1 therein. The projection lens projects a pattern on a reticle R uniformly illuminated with light from an illumination device 102 onto a wafer W placed on a stage 103 in a reduced size. An air chamber h corresponding to an 8th space and an air chamber n corresponding to a 14th space are defined by lenses L7 and L8 for the former and lenses L13 and L14 for the latter and the inner wall of the housing 101, thereby providing independent first and second air chambers which are shielded from the outer atmosphere. The air chambers h and n are respectively coupled to barometric controllers 126 and 128 outside the housing 101 through pipes 122 and 124. Air under a predetermined pressure is constantly supplied from a compressed air supply 130 to the respective barometric controllers 126 and 128 through filters 132 and 134, respectively. Pressure sensors 110 and 112 are arranged at the side surface of the respective air chambers h and n so as to detect the internal pressures therein. Output signals from the pressure sensors 110 and 112 are supplied to a computer 136. The computer 136 also receives a measurement signal of the outer atmosphere from a barometer 138. As has been described above, the computer 136 stores therein the amounts of changes $\Delta X_1$ and $\Delta X_2$ in magnification factor and the amounts of changes $\Delta Z_1$ and $\Delta Z_2$ in the position of the imaging plane per unit pressure change in each of the air chambers h and n, and also stores therein a change $\Delta X$ in magnification factor and a change $\Delta Z$ in the position of the imaging surface per unit change in the barometric pressure of the outer atmosphere. In accordance with the signal from the barometer 138, the computer 136 calculates the amount of change $\Delta P$ in the barometric pressure of the outer atmosphere, and the amounts of changes $\Delta P_1$ and $\Delta P_2$ of the respective air chambers in order to satisfy the conditions in the equations (1-2), and generates signals for performing barometric control by means of the barometric controllers 126 and 128. The barometric controllers 126 and 128 perform the flow control by means of needle valves or the like in accordance with the signals from the computer 138 so as to change the pressures therein by $\Delta P_1$ and $\Delta P_2$.

As has been described above, when there are at least two spaces on the optical axis of the projection lens which allow barometric control, changes in both the projection magnification factor and the position of the imaging plane can be controlled. However, if a means is adopted for moving the lens elements of the projection lens along its optical axis or for changing the distance between the reticle and the projection lens, barometric control can be performed only for a single space. If the projection exposure apparatus has a function for detecting and following a change in the position of the imaging plane, barometric control of only a single space can be performed to compensate for a change in the magnification factor. When it is desired to perform barometric control for only a single space in an exposure apparatus having no function of detecting the position of the imaging plane, a space having a small change in the position of the imaging plane such as the 8th space h is preferably selected. The remaining nonselected spaces must be communicated with the outer atmosphere through holes formed in the housing so as to allow the pressures therein to follow changes in the barometric pressure of the outer atmosphere. Alternatively, these remaining spaces can be completely sealed.

Figure 3:
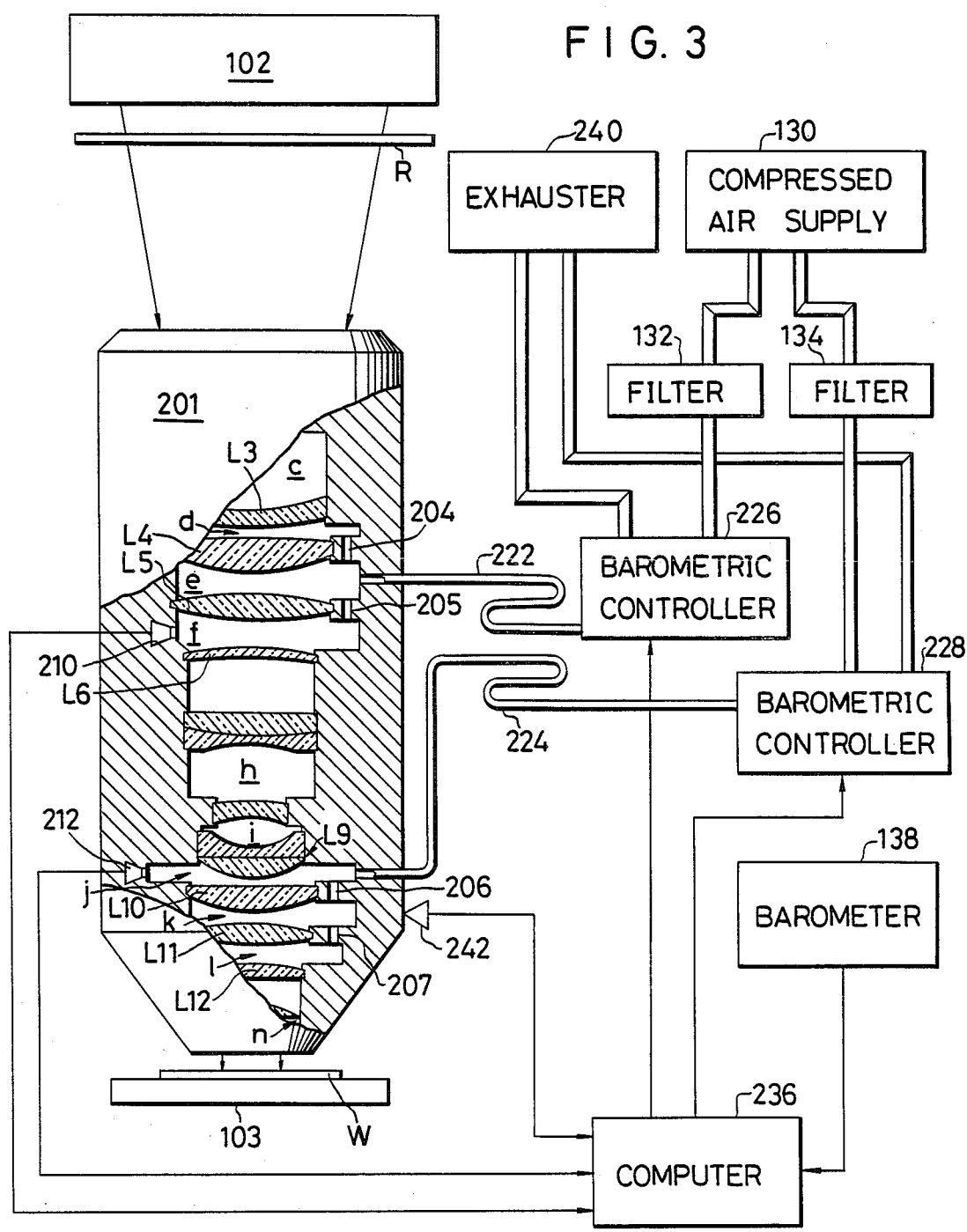
FIG. 3 is a partially sectional view of a projection exposure apparatus according to a second embodiment of the present invention.

FIG. 3 shows a second embodiment of the present invention wherein at least two air chambers are communicated with each other. When the amount of change in the magnification factor for a change in a unit barometric pressure of the outer atmosphere is represented by $\Delta X_P$ and the control amount of the pressure inside a coupled or combined air chamber is represented by $\Delta P_I$, the change in the magnification factor in accordance with the amount of change $\Delta P$ in barometric pressure of the outer atmosphere can be corrected by satisfying the following relation:

$$\Delta P_I(\Delta X_1+\Delta X_2)+\Delta P\Delta X_p=0 \qquad (2\text{-}1)$$

When the values of the changes $\Delta X_1$ and $\Delta X_2$ are selected to have the same sign, a greater change in magnification factor can be obtained with a coupled chamber than that obtained with a single air chamber. Therefore, the change in the magnification factor due to a change in the barometric pressure of the outer atmosphere can be corrected with a smaller correction amount. Since the magnitude of change in pressure of the air chamber subjected to barometric control can be kept relatively small, air leakage is small and control is easy.

However, when the pressure in the two air chambers constituting the coupled chamber is changed, the imaging plane is, by necessity, changed. In view of this problem, a third air chamber can be communicated with the two air chambers so that the pressure of the obtained coupled chamber is controlled. When the amount of change in the magnification factor and the amount of change in the position of the imaging plane for a unit pressure change in the third air chamber are represented by $\Delta X_3$ and $\Delta Z_3$, respectively, if a third air chamber is selected to satisfy the following equation:

$$\Delta Z_3=\Delta Z_1+\Delta Z_2$$

the magnification factor alone can be changed, and so corrected, while the imaging plane is kept at a fixed position. In order to do this, the pressure in the three air chambers must be changed by the amount $\Delta P_I$ satisfying the equation below:

$$\Delta P_I(\Delta X_1+\Delta X_2+\Delta X_3)+\Delta P\Delta X_p=0 \qquad (2\text{-}2)$$

When this equation is satisfied, the change in the position of the imaging plane satisfies the following equation:

$$\Delta P_I(\Delta Z_1+\Delta Z_2+\Delta Z_3)=0$$

and the position of the imaging plane does not change.

In order to simultaneously correct the magnification factor and the position of the imaging plane, an additional fourth air chamber is subjected to barometric control in the second embodiment as in the case of the first embodiment. Assume that the amount of change in the magnification factor for a unit change in pressure in this fourth air chamber is represented by $\Delta X_4$, the amount of change in the position of the imaging plane is represented by $\Delta Z_4$, and the pressure control amount of the fourth air chamber is represented by $\Delta P_{II}$. In this case, if the pressure of the coupled chamber is changed by the amount $\Delta P_I$ that in the fourth air chamber is changed by $\Delta P_{II}$, so as to satisfy the following equations:

$$\Delta P_I(\Delta X+\Delta X_2)+\Delta P_{II}\Delta X_4+\Delta P\Delta X_p=0$$

$$\Delta P_I(\Delta Z_1+\Delta Z_2)+\Delta P_{II}\Delta Z_4+\Delta P\Delta Z_p=0 \qquad (2\text{-}3)$$

the changes $\Delta X_p$ and $\Delta Z_p$ in the magnification factor and the imaging plane can be simultaneously corrected. When the fourth air chamber is communicated with one or more of the remaining air chambers, an increase in the correction amount can be prevented as in the case of the two air chambers which are communicated with each other. Furthermore, when air chambers capable of cancelling other optical performance items, for example, specific aberrations are suitably combined, and magnification factor and the imaging plane can be corrected without changing the aberration.

In order to simultaneously correct three selected performance items among the various optical performance items, three independent control spaces can be arranged. In general, therefore, independent pressure-controlled spaces corresponding in number to the various optical performance items to be corrected can be arranged.

Factors leading to changes in various optical performance items such as changes in the magnification factor of the projection lens and in the position of the imaging plane include not only changes in barometric pressure but also those in ambient temperature, humidity, temperature of the projection lens upon exposure thereof, and the like. When the changes in the magnification factor which are generated upon unit changes in these factors are respectively represented by $\Delta X_q$, $\Delta X_r$, and $\Delta X_s$, the corresponding changes in the imaging plane are represented by $\Delta Z_q$, $\Delta Z_r$ and $\Delta Z_s$, and the corresponding changes in the ambient temperature, humidity and temperature of the projection lens due to exposure thereof are represented by $\Delta Q$, $\Delta R$ and $\Delta S$, respectively, if a pressure control amount $\Delta P_I$ of the two coupled air chambers and a pressure control amount $\Delta P_{II}$ of the fourth air chamber satisfy the following equations:

$$\Delta P_I(\Delta X_1 + \Delta X_2) + \Delta P_{II}\Delta X_4 + \Delta P\Delta X_p + \Delta Q\Delta X_q \quad (2\text{-}4)$$
$$+ \Delta R\Delta X_r + \Delta S\Delta X_s = 0$$
$$\Delta P_I(\Delta Z_1 + \Delta Z_2) + \Delta P_{II}\Delta Z_4 + \Delta P\Delta Z_p + \Delta Q\Delta Z_q$$
$$+ \Delta R\Delta Z_r + \Delta S\Delta Z_s = 0$$

both the magnification factor and the imaging plane position can be satisfied simultaneously.

It is seen from Table 2 above, that the changes $\Delta X$ in the magnification factor in the fourth space d, the fifth space e and the sixth space f are all negative values. Therefore, if these fourth to sixth spaces d to f are communicated with each other while shielded from the outer atmosphere, a considerably large correction amount can be obtained with a relatively small pressure control amount, which is suitable for pressure control for correcting the magnification factor. Referring to Table 2 again, the changes $\Delta Z$ in the imaging plane in the fourth to sixth spaces are the three largest values. Therefore, if these spaces are communicated with each other so as to control the pressures therein at the same time, the imaging plane can also be corrected with a relatively small pressure control amount. It also seen that the tenth space j, the eleventh space k, and the twelfth space l are also considerably associated with the changes in the imaging plane position. Thus, if the tenth to twelfth spaces j to l are communicated with each other and shielded from the outer atmosphere to form a coupled air chamber, the imaging plane can e easily corrected. As for the changes in the imaging plane, it is seen that the changes in the first space a and the second space b have the opposite signs, and have substantially the same absolute values so that they cancel each other. It is further seen that the changes in the seventh space g can be cancelled with a combination of the fourteenth space n and the fifteenth space o and that the changes in the magnification factors in the fourteenth and fifteenth spaces n and o are relatively small and substantially cancel each other. Therefore, if the fourth to sixth spaces e to f are pressure-controlled as a coupled air chamber, and the tenth to twelfth chambers j to l are separately pressure-controlled as another coupled air chamber, both the magnification factor and the imaging plane can be simultaneously corrected. Furthermore, since the changes in the first space a and the second space b substantially cancel each other, and those in the seventh space g and in the fourteenth and fifteenth spaces n and o substantially cancel each other, they are controlled such that their pressures change in accordance with changes in the barometric pressure of the outer atmosphere. However, the remaining spaces, i.e., the third space c, the eighth space h, the ninth space i, and the thirteenth m are preferably shielded from the outer atmosphere so that the pressures therein do not change.

In a projection lens 201 shown in FIG. 3, three air chambers corresponding to the fourth to sixth spaces d to f are coupled through communication holes 204 and 205, shielded from the outer atmosphere, and pressure-controlled as a first pressure control space through a pipe 222. Three air chambers corresponding to the tenth to twelfth spaces j to l are coupled through communication holes 206 and 207, shielded from the outer atmosphere, and pressure-controlled as a second pressure control space through a pipe 224. Air chambers corresponding to the third space c, the eighth space h, the ninth space i, and the thirteenth space m are shielded from the outer atmosphere. The first and second pressure control spaces are respectively controlled by barometric controllers 226 and 228, respectively. The respective barometric controllers 226 and 228 are connected to an exhauster 240 to be evacuated as needed, and to a compressed air supply 130 through filters 132 and 134. Pressure sensors 210 and 212 are coupled to the sides of the first and second pressure control spaces so as to detect the internal pressures therein. Output signals from the pressure sensors 210 and 212 are supplied to a computer 236 for controlling the barometric controllers 226 and 228. The computer 236 receives a value corresponding to the barometric pressure of the outer atmosphere from a barometer 138, that of the ambient temperature outside the projection lens from a temperature sensor 242, a temperature inside the lens 201, and the humidity therein. In the computer 236, the changes $\Delta X_d$, $\Delta X_e$, $\Delta X_f$, $\Delta X_j$, $\Delta X_k$, $\Delta X_l$ in magnification factor and changes $\Delta Z_d$, $Z_e$, $\Delta Z_f$, $\Delta Z_j$, $\Delta Z_k$ and $\Delta Z_l$ in the imaging plane with respective to unit pressure change in the respective pressure control spaces are stored in advance. The computer 236 also stores the change $\Delta X_p$ in the magnification factor of the projection lens and the change $\Delta Z_p$ in the imaging plane corresponding to unit change in barometric pressure of the outer atmosphere; changes $\Delta X_q$ and $\Delta X_r$; and $\Delta Z_q$ and $\Delta Z_r$ in the magnification factor and imaging plane with respect to unit changes in temperature and humidity around the housing; and changes $\Delta X_s$ and $\Delta Z_s$ in the magnification factor and imaging plane with respect to changes in the temperature of the projection lens due to exposure energy. The computer 236 detects the change $\Delta P$ in barometric pressure of the outer atmosphere, changes $\Delta Q$ and $\Delta R$ in ambient temperature and humidity outside the housing, and the change $\Delta S$ in temperature of the projection lens due to exposure energy, and then calculates the changes $\Delta P_I$ and $\Delta P_{II}$ required for the pressure control spaces satisfying the equations (2-4). In summary, the conditions to be satisfied in this embodiment are, for the changes in the magnification factor:

$$\Delta P_I(\Delta X_d+\Delta X_e+\Delta X_f)+\Delta P_{II}(\Delta X_j+\Delta X_k+\Delta K_l)$$
$$+\Delta P\Delta X_p+\Delta Q\Delta X_q+\Delta R\Delta X_r+\Delta S\Delta X_s=0$$

and, for the changes in the imaging plane, $$\Delta P_I(\Delta Z_d+\Delta Z_e+\Delta Z_f)+\Delta P_{II}(\Delta Z_j+\Delta Z_k+\Delta Z_l)$$
$$+\Delta P\Delta Z_p+\Delta Q\Delta Z_q+\Delta R\Delta X_r+\Delta S\Delta X_s=0$$

where $\Delta X$ and $\Delta Z_p$ are sums of changes in the magnification factor and imaging plane due to the air whose pressure changes in accordance with changes in the barometric pressure of the outer atmosphere, and are respectively given by:

$$\Delta X_p = \Delta X_a + \Delta X_b + \Delta X_g + \Delta X_n + \Delta X_0$$

$$\Delta Z_p = \Delta Z_a + \Delta Z_b + \Delta Z_g + \Delta Z_n + \Delta Z_0$$

A third embodiment of the present invention will now be described. In the third embodiment, the air chambers for pressure control are selected in accordance with the following theory. That is, the ratio of the change in the magnification factor to that in the imaging plane of the projection lens in an air chamber which is to be controlled by a barometric controller is set to be substantially equal to the ratio of the change in the magnification factor to that in the imaging plane which is caused due to a predetermined external factor (e.g., a change in barometric pressure of the outer atmosphere) of the projection lens.

A change in the magnification factor of a projection lens having a plurality of pressure control air chambers is in general a sum of changes in the magnification factor in the respective air chambers which are pressure-controlled together and is expressed by $\Sigma \Delta X_c$. A change in the position of the imaging plane of the projection lens is similarly a sum of changes in the imaging plane position in the respective air chambers and is expressed by $\Sigma \Delta Z_c$. When changes in the magnification factor and in the imaging plane which are caused upon changes in barometric pressure are to be corrected, the changes in the entire system equal those which are caused by all the air chambers from the reticle to the wafer except for the pressure control air chambers described above. The change $\Delta X(P)$ in the magnification factor attributable to the air chambers except for the pressure control air chambers with respect to a unit change in barometric pressure of the outer atmosphere is a sum of changes in the magnification factor in all these air chambers and is expressed by:

$$\Delta X(P) = \Sigma \Delta X_R$$

The change $\Delta Z(P)$ in the position of the imaging plane is also a sum of the changes in the imaging plane in all the air chambers except for the pressure control air chambers and is given by:

$$\Delta Z(P) = \Sigma \Delta Z_R$$

Thus, the ratio of the change in the magnification factor to that in imaging plane position upon a change in barometric pressure is represented by V(P) and is given by:

$$V(P) = \Delta Z(P)/\Delta X(P) \tag{3-1}$$

Likewise, the ratio C of the change in magnification factor to that in imaging plane position in the pressure control air chambers is given by:

$$C = \Sigma \Delta Z_c / \Sigma \Delta X_c \tag{3-2}$$

When an air chamber which has a correction ratio C equal to the ratio V(P) with respect to a change in barometric pressure of the outer atmosphere is incorporated, changes in both the magnification factor and the imaging plane position due to a change in barometric pressure of the outer atmosphere can be simultaneously corrected. Thus, the coupled air chamber can be formed by combining the spaces between the lenses of the projection lens so as to satisfy from the equations (3-1) and (3-2):

$$\Delta Z(P)/\Delta X(P) = \Sigma \Delta Z_c / \Sigma \Delta X_c \tag{3-3}$$

The equation (3-3) can be rewritten as:

$$\Delta Z(P)/\Sigma \Delta Z_c = \Delta X(P)/\Sigma \Delta X_c = \alpha \tag{3-4}$$

where $\alpha$ is the ratio of pressure control amount with respect to a change in pressure to a correction amount, in other words, a control ratio. With a change in barometric pressure of 1, for example, the pressure change of $\alpha$ times with an opposite sign can be applied to the coupled air chamber. Thus, for the change in barometric pressure of the outer atmosphere of $\Delta P$, the pressure in the coupled air chamber is reduced or increased by $\alpha \cdot \Delta P$. Then, the resultant change $\Delta X$ in magnification factor is given by:

$$\begin{aligned}\Delta X &= \Delta P \cdot \Delta X(P) - \alpha \cdot \Delta P \cdot \Sigma \Delta X_c \\ &= \Delta P \cdot \{\Delta X(P) - \alpha \cdot \Sigma \Delta X_c\}\end{aligned} \tag{3-5}$$

Since from the equation (3-4)

$$\alpha \cdot \Sigma \Delta X_c = \Delta X(P)$$

we have:

$$\Delta X = \Delta P \cdot \{\Delta X(P) - \Delta X(P)\} = 0 \tag{3-5}$$

and the change in the magnification can be completely corrected.

Similarly, the change $\Delta Z$ in the imaging plane after correction is given by:

$$\Delta Z = \Delta P \cdot \Delta Z(P) - \alpha \cdot \Delta P \cdot \Sigma \Delta Z_c \tag{3-6}$$

Since from the equation (3-4)

$$\alpha \cdot \Sigma \Delta Z_c = \Delta Z(P)$$

we have:

$$\Delta Z = 0 \tag{3-6}$$

and the change in the imaging plane is also simultaneously corrected.

In the above description, changes in magnification factor and imaging plane position due to changes in barometric pressure are corrected. As has been described above, external factors influencing the magnification factor and imaging plane of the projection lens include not only changes in barometric pressure of the outer atmosphere but also temperature changes in the lens itself due to changes in ambient temperature or absorption of exposure energy. Although a projection optical apparatus can be kept in the normal state with a relatively good precision for a change in ambient temperature, compensation for changes in the lens temperature due to absorption of the exposure energy is difficult. According to the present invention, however, changes in magnification factor and imaging plane position which are caused due to temperature changes of the lens upon irradiation of exposure energy can be simultaneously corrected with high precision.

When the change in magnification factor of the entire lens system per unit incident exposure energy is represented by ΔX(E) and that in the imaging plane is represented by ΔZ(E), the ratio V(E) of the change in magnification factor to that in imaging plane position upon a temperature change of the lens due to absorption of exposure energy is given by:

$$V(E) = \Delta Z(E)/\Delta X(E) \tag{3-7}$$

Thus, it is concluded that the lens intervals or spaces need be combined only so that the correction ratio C obtained with the coupled air chamber represented by the equation (3-2) corresponds to the change ratio V(E) due to the exposure energy absorption of the lens represented by the equation (3-7). In other words, the pressure control air chambers are formed so as to satisfy:

$$Z(E)/\Delta X(E) = \Sigma \Delta Z_c / \Sigma \Delta X_c \tag{3-8}$$

When the equation (3-8) is rewritten by multiplying the term ΔE with the numerator and denominator of the left side and multiplying the term ΔP with the numerator and denominator of the right side, we have:

$$\Delta E \cdot \Delta Z(E)/\Delta P \cdot \Sigma \Delta Z_c = \Delta E \cdot \Delta X(E)/\Delta P \cdot \Sigma \Delta X_c = \alpha' \tag{3-9}$$

where α' is a control ratio similar to the control ratio α in the equation (3-4).

Therefore, when the exposure energy incident on the lens changes by ΔE, if the pressure of the coupled air chamber is changed by −α'·ΔP, the change ΔX in magnification factor after correction can be represented by:

$$\Delta X = \Delta E \cdot \Delta X(E) - \alpha' \cdot \Delta P \cdot \Sigma \Delta X_c$$

Since from the equation (3-9)

$$\alpha' \cdot \Delta P \cdot \Sigma \Delta X_c = \Delta E \cdot \Delta X(E)$$

we have:

$$\Delta X = 0$$

and the change in magnification factor is completely corrected. Similarly, the change ΔZ in the position of the imaging plane after correction can be expressed by:

$$\Delta Z = \Delta E \cdot \Delta Z(E) - \alpha' \cdot \Delta P \cdot \Sigma \Delta Z_c$$

and is rewritten using the equation (3-9) as:

$$\Delta Z = 0$$

so that the imaging plane is corrected simultaneously with the magnification factor.

Figure 4:
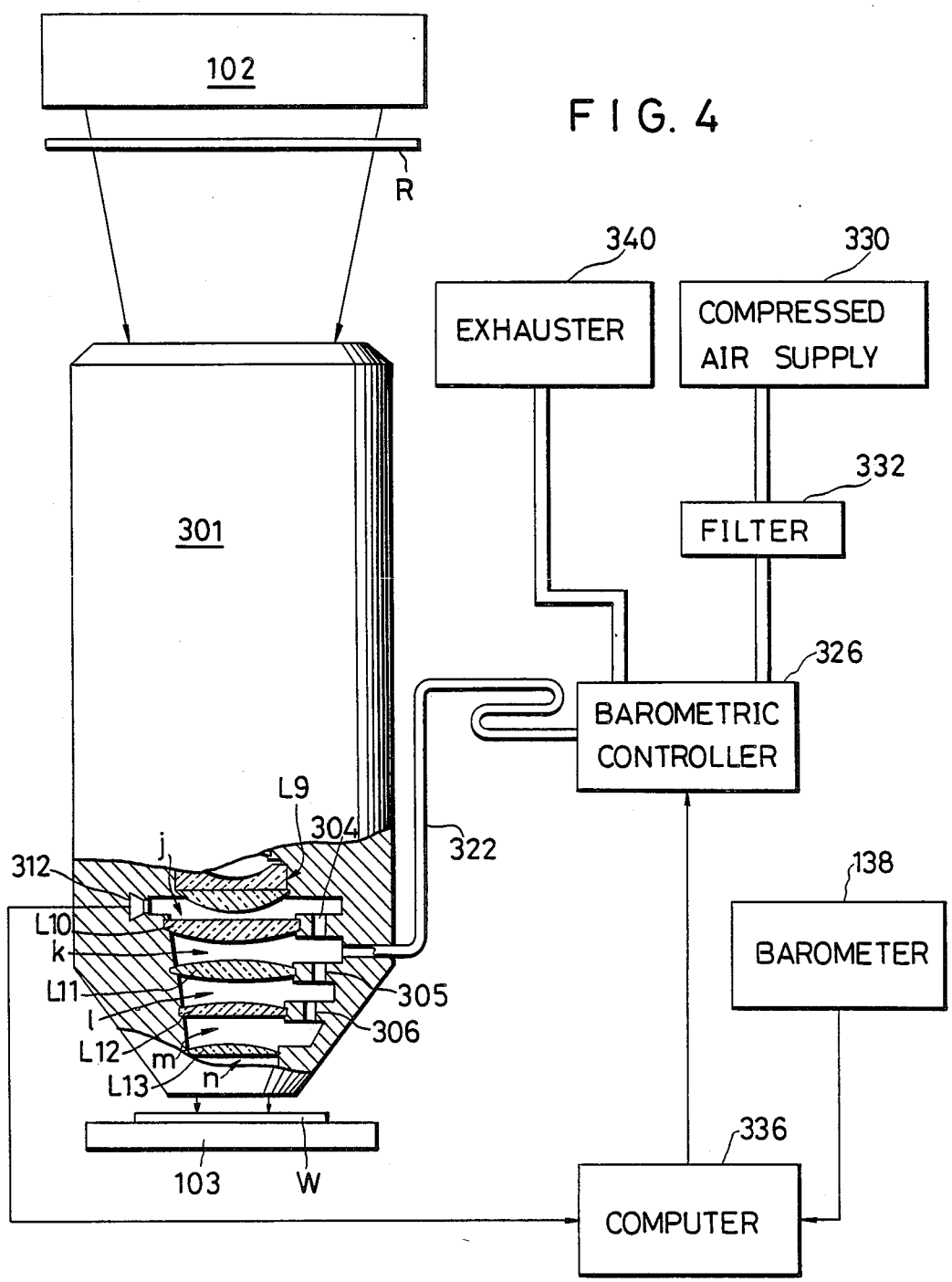
FIG. 4 is a partially sectional view of a projection exposure apparatus according to a third embodiment of the present invention.

A projection exposure apparatus according to the third embodiment as described above is illustrated in FIG. 4. The projection lens as shown in FIG. 1 is housed in a housing 301. Four consecutive spaces, i.e., tenth space j to thirteenth space m are shielded from the outer atmosphere and are communicated with each other through communication holes 304, 305 and 306 so as to form a coupled air chamber. The internal pressure in the coupled air chamber is controlled through a barometric controller 326 through a pipe 322.

The respective values of the changes $\Sigma \Delta X_c$ and $\Sigma \Delta Z_c$ in magnification factor and imaging plane for unit change in pressure in the spaces j, k, l and m constituting the coupled air chamber, and changes ΔX(P) and ΔZ(P) in magnification factor and imaging plane position in the remaining spaces of the entire system excluding the coupled air chamber are calculated in accordance with Table 2, and are given as in Table 3 below. Note that Table 3 below also shows the correction ratio C in the coupled air chamber and the change ratio V(P) due to change in barometric pressure of the outer atmosphere.

TABLE 3

| $\Sigma \Delta X_c$ | $\Sigma \Delta Z_c$ | ΔX(P) | ΔZ(P) |
|---|---|---|---|
| 0.63/137.5 | 9.05/137.5 | 0.374/137.5 | 5.78/137.5 |
| C = $\Sigma \Delta Z_c / \Sigma \Delta X_c$ | | V(P) = ΔZ(P)/ΔX(P) | |
| 14.365 | | 15.455 | |

With the apparatus having the construction as described above, the ratio of the value of the correction ratio C to the change ratio V(P) is 0.929(=C/V(P)) and the ratio values are substantially equal to each other. As may be seen from the equations (3-5) and (3-5') and (3-6) and (3-6') are substantially equal to each other, the changes in magnification factor and imaging plane can be corrected simultaneously. The control ratio α is given to be 0.62 when it is assumed to be an average value between the control ratio for a change in the imaging plane position given by the left side of the equation (3-4) and that for a change in the imaging plane position by the central portion of the equation (3-4) for a change in the imaging plane position. Substitution of respective values in the equation (3-5) for a case wherein the change in barometric pressure of the outer atmosphere is +137.5 mmHg yields:

$$\Delta X = 0.374 - 0.62 \times 0.63 = -0.017$$

This value is corrected within a ratio of 2% or less with respect to the change in magnification factor of +1.004 obtained with no correction, indicating that a satisfactory correction has been performed. Substitution of respective values in the equation (3-5) yields:

$$\Delta Z = 5.78 - 0.62 \times 9.05 = 0.169$$

This value is corrected within a ratio of about 1% with respect to the change in imaging plane position of +14.83 obtained with no correction, indicating that a satisfactory correction has been performed.

A barometric controller 326 is coupled to a compressed air supply through a filter 332 and to an exhauster 340. The barometric controller 326 is controlled by a computer 336 which is, in turn, connected to a pressure sensor 312 and a barometer 138. The computer 336 stores therein the values of $\Sigma \Delta X_c$, $\Sigma \Delta Z_c$, ΔX(P) and ΔZ(P) therein, which together define the value of the control ratio α. The computer 336 calculates the change ΔP and supplies to the barometric controller 326 a pressure control signal corresponding to −k·ΔP. The value −k·ΔP is obtained by multiplying a required pressure control amount coefficient K of the opposite sign to the change ΔP. In response to the received signal, the barometric controller 326 changes the pressure in the air chamber by −k·ΔP.

Assume a case wherein in addition to the spaces j, k, l, and m constituting the coupled air chamber, a fourteenth space n is also shielded from the outer atmosphere and the remaining spaces are communicated with the outer atmosphere. Table 4 shows the changes in magnification factor and imaging plane, the correction ratio and the change ratio in this case.

TABLE 4

| $\Sigma\Delta X_c$ | $\Sigma\Delta Z_c$ | $\Delta X(P)$ | $\Delta Z(P)$ |
|---|---|---|---|
| 0.63/137.5 | 9.05/137.5 | 0.382/137.5 | 5.16/137.5 |
| $C = \Sigma\Delta Z_c/\Sigma\Delta X_c$ | | $V(P) = \Delta Z(P)/\Delta X(P)$ | |
| 14.365 | | 13.508 | |

It is seen from Table 4 above that the values of $\Sigma\Delta X_c$ and $\Sigma\Delta Z_c$ and the correction ratio C are similar to those in Table 3, and the values of $\Delta X(P)$ and $\Delta Z(P)$ are different from those in Table 3 for the changes corresponding to the fourteenth space n. Therefore, the change ratio V(P) is also different from that shown in Table 3. In this case, the ratio of the correction ratio C to the change ratio V(P) is 1.063 (=C/V(P)), which is closer to 1 than in the case of Table 3. When the control ratio $\alpha$ is considered as an average value of the control ratios for the changes in the magnification factor and imaging plane, it is given as 0.59. Substitution of the respective values in the equations (3-5) and (3-6) and calculation of the respective changes provide:

$$\Delta X = 0.382 - 0.59 \times 0.63 = 0.010$$

$$\Delta Z = 5.16 - 0.59 \times 9.05 = -0.18$$

This change $\Delta X$ in magnification factor is 1% of that obtained with no correction, and the change $\Delta Z$ in the position of the imaging plane is also about 1% of that obtained with no correction. These values show that both the magnification factor and the imaging plane have been corrected well.

Figure 5:
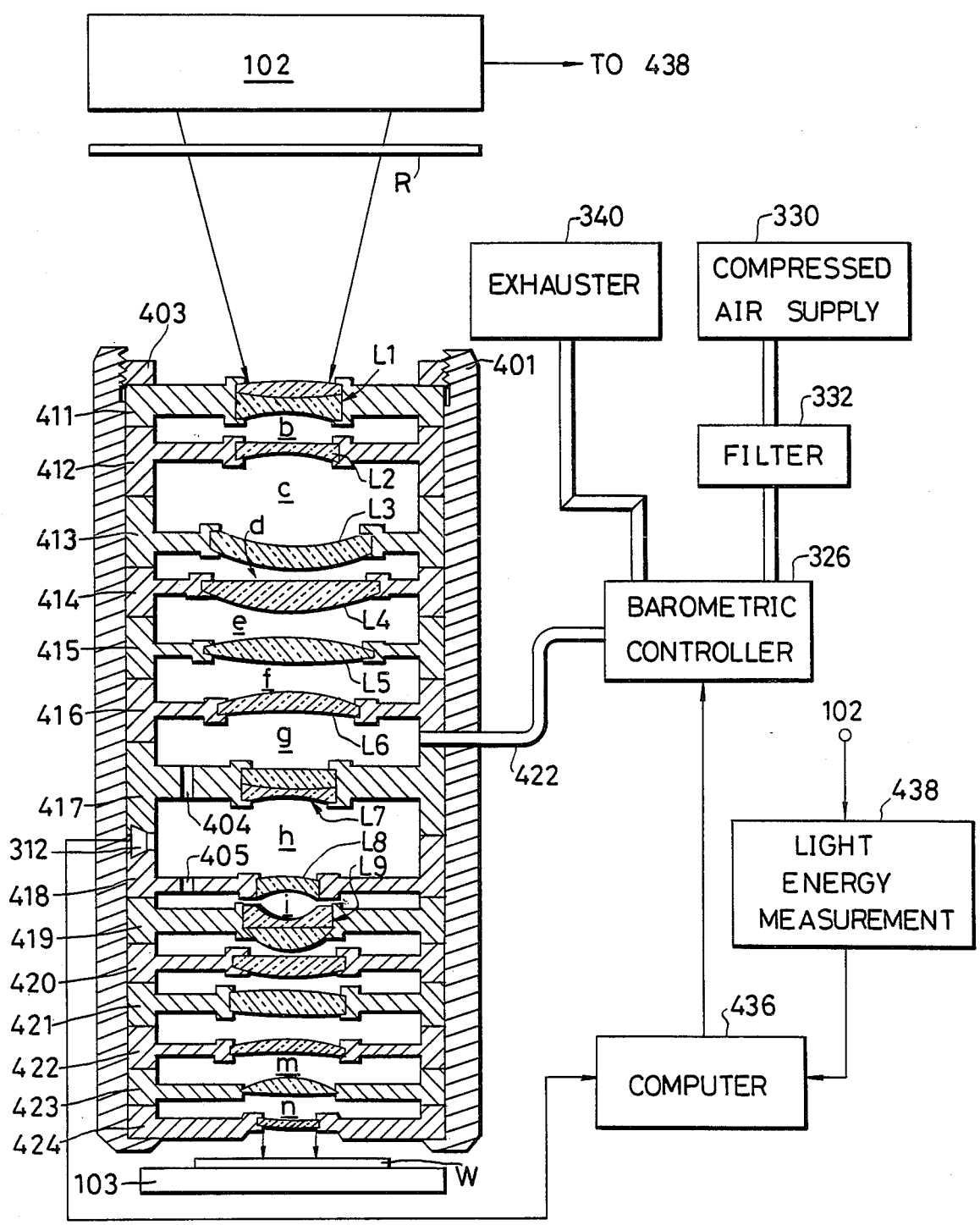
FIG. 5 is a partially sectional view of a projection exposure apparatus according to a fourth embodiment of the present invention.

FIG. 5 shows an embodiment of a projection lens wherein all the spaces within a housing are shielded from the outer atmosphere. Therefore, changes in optical performance in this apparatus are attributed to a temperature change in the projection lens upon absorption of exposure energy or a change in ambient temperature. Fourteen lenses $L_1$ to $L_{14}$ constituting the projection lens are respectively supported by first through fourteenth inner barrels 411 to 424. These fourteen inner barrels when stacked constitute an inner barrel which is supported by a housing 401 and is fixed by a press ring 403. Thirteen lens spaces b to n are formed in the housing by the fourteen inner barrels. Communication holes 404 and 405 communicating with the adjacent spaces are formed in the seventh inner barrel 417 supporting the seventh lens $L_7$ and in the eighth inner barrel 418 supporting the eighth lens. The three lens spaces g, h and i are integrally shielded from the outer atmosphere by the sixth inner barrel 416 supporting the sixth lens $L_6$ and by the ninth inner barrel 419 supporting the ninth lens $L_9$ so as to form a coupled air chamber. The pressure in this coupled air chamber is controlled by a barometric controller 326 through a pipe 422. The remaining spaces b to f and j to n are shielded from the outer atmosphere by the inner barrels 411 to 417 and 419 to 424 and are kept at a predetermined pressure.

Of the lens spaces of the projection lens, the remaining lens spaces except for the three lens spaces g, h and i for simultaneous pressure control are all shielded from the outer atmosphere, so that changes in magnification factor and imaging plane position are substantially negligible. For this reason, changes in magnification factor and imaging plane position due to an external factor, such as a change in lens temperature upon absorption of exposure energy can be corrected. The values of the changes $\Sigma\Delta X_c$ and $\Sigma\Delta Z_c$ in the spaces g, h and i and the value of the correction ratio C are obtained as shown in Table 5 below:

TABLE 5

| $\Sigma\Delta X_c$ | $\Sigma\Delta Z_c$ |
|---|---|
| 0.441/137.5 | −5.76/137.5 |
| $C = \Sigma\Delta Z_c/\Sigma\Delta X_c$ | |
| −13.061 | |

According to this embodiment, correction against an external factor which results in a ratio of the changes in magnification factor to that in imaging plane of about −13 can be performed. In general, when the projection lens absorbs exposure energy and its temperature is increased thereby, the magnification factor is changed by a positive or negative small value in a direction such that the imaging plane draws closer to the projection lens, that is, in a direction such that the imaging plane is moved in the negative direction. In this embodiment, the ratio of positive to negative changes in magnification factor can be set to be −1:13 by reducing the pressure in the coupled air chamber. Therefore, the negative and positive changes due to temperature increase in the projection lens can be simultaneously corrected.

Since the changes in magnification factor and imaging plane position upon a temperature increase of the projection lens are different depending upon the material of the projection lens, the changes must be precisely determined in each projection lens by actual measurements. The coupled air chamber is then obtained by combining suitable lens spaces so as to provide a correction ratio C closest to the change ratio V(E) obtained from the actual measurements.

In the apparatus shown in FIG. 5, a light energy measurement circuit 438 for measuring the illumination energy of an illumination device 102 is arranged. A computer 436 controls a barometric controller 326 so as to provide suitable correction pressures to lens spaces g, h and i for the measured illumination energy.

In the above description, the partial pressures of respective gas components such as $N_2$, $O_2$, $CO_2$ and $H_2O$ and the like in the air have not be considered, but only the total pressure has be considered. However, since it is essential to change the refractive index of the air in each chamber, it is also possible to use only $N_2$ gas, for example, or to control the partial pressure of each component of a gas mixture so as to change the refractive index of the gas mixture.

What is claimed is:

1. A method for adjusting imaging performance of a projection lens system having a plurality of lens elements arranged at predetermined intervals, comprising the steps of:

(a) measuring variation in barometric pressure of an outer atmosphere;

(b) selecting a first space from a plurality of spaces defined by said plurality of lens elements such that variation of a predetermined amount in the pressure of said first space changes a first imaging performance of said projection lens system by a minimum amount relative to other spaces, and selecting a second space from a plurality of spaced defined by said plurality of lens elements such that variations of a predetermined amount in the pressure of said second space changes a second imaging performance of said projection lens system by a minimum amount relative to other spaces, one of said first and second imaging performances being the position of an imaging plane and the other being a magnification factor of said projection lens system;

(c) determining internal pressure of said first space so as to maintain said second imaging performance of said projection lens system in spite of variation in barometric pressure of the outer atmosphere, and determining internal pressure of said second space so as to maintain said first imaging performances of said projection lens system in spite of variation in barometric pressure of the outer atmosphere; and (d) controlling the pressure in said first and second spaces independently of each other so that said internal pressures therein coincide with the internal pressures determined in said step (c), respectively.

2. A method according to claim 1, wherein internal pressure of said first and second spaces are determined by the following formulae:

$$\Delta P_1 \cdot \Delta X_1 + \Delta P_2 \cdot \Delta X_2 + \Delta P \cdot \Delta X = 0$$

$$\Delta P_1 \cdot \Delta Z_1 + \Delta P_2 \cdot \Delta Z_2 + \Delta P \cdot \Delta Z = 0$$

where $\Delta P_1$ and $\Delta P_2$ stand for the respective variations in internal pressures of said first and second spaces;

$\Delta P$ stands for variation in barometric pressure of the outer atmosphere;

$\Delta X_1$ and $\Delta X_2$ stand for variations in magnification factor of said projection lens system for variation in internal pressure of said first and second spaces, respectively; and $\Delta Z_1$ and $\Delta Z_2$ stand for variations in position of the imaging plane of said projection lens system for variation in internal pressure of said first and second spaces, respectively.

3. A method for adjusting imaging performance of a projection lens system having a plurality of lens elements arranged at predetermined intervals, comprising the steps of:

(a) measuring variation in temperature of said projection lens system;

(b) selecting a first space from a plurality of spaces defined by said plurality of lens elements such that variation of a predetermined amount in the pressure of said first space changes a first imaging performance of said projection lens system by a minimum amount relative to other spaces, and selecting a second space from a plurality of spaces defined by said plurality of lens elements such that variation of said predetermined amount in the pressure of said second space changes a second imaging performance of said projection lens system by a minimum amount relative to other spaces, one of said first and second imaging performances being the position of an imaging plane and the other being a magnification factor of said projection lens system;

(c) determining internal pressure of said first space so as to maintain said second imaging performance of said projection lens system in spite of variation in temperature of said projection lens system, and determining internal pressure of said second space so as to maintain said first imaging performance of said projection lens system in spite of variation in temperature of said projection lens system; and (d) controlling the pressure in said first and second spaces independently of each other so that said internal pressures therein coincide with the internal pressures determined in said step (c), respectively, 4. An apparatus for projection of a pattern of a first plane onto a second plane, comprising:

a projection lens system interposed between the first and second plane, said projection lens system including a plurality of lens elements arranged at predetermined intervals and defining a plurality of spaces therebetween;

means for shielding at least two spaces, including first and second spaces, of said plurality of spaces from an outer atmosphere, said first space being selected such that variation of a predetermined amount in the pressure of said first space changes a first imaging performance of said projection lens system by a minimum amount relative to other spaces, and said second space being selected such that variation of said predetermined amount in the pressure of said second space changes a second imaging performance of said projection lens system by a minimum amount relative to other spaces, one of said first and second imaging performances being the position of an imaging plane and the other being a magnification factor of said projection lens system;

means for measuring variation in barometric pressure of the outer atmosphere;

means for determining internal pressure of said first space so as to maintain said second imaging performance of said projection lens system in spite of variation in barometric pressure of the outer atmosphere, and internal pressure of said second space so as to maintain said first imaging performance of said projection lens system in spite of variation in barometric pressure of the other atmosphere; and means for controlling the pressure in said first and second spaces independently of each other so that said internal pressures therein coincide with the internal pressures determined by said determining means, respectively.

5. An apparatus according to claim 4, wherein internal pressures of said first and second spaces are determined by the following formulae:

$$\Delta P_1 \cdot \Delta X_1 + \Delta P_2 \cdot \Delta X_2 30\ \Delta P \cdot \Delta X = 0$$

$$\Delta P_1 \cdot \Delta Z_1 + \Delta P_2 \Delta \Delta Z_2 + \Delta P \cdot \Delta Z = 0$$

where $\Delta P_1$ and $\Delta P_2$ stand for the respective variations in internal pressures of said first and second spaces;

$\Delta P$ stands for variation in barometric pressure of the outer atmosphere;

$\Delta X_1$ and $\Delta X_2$ stand for variations in magnification factor of said projection lens system for variation in internal pressure of said first and second spaces, respectively; and $\Delta Z_1$ and $\Delta Z_2$ stand for variations in position of the imaging plane of said projection lens system for variation in internal pressure of said first and second spaces, respectively.

6. An apparatus for projection of a pattern on a first plane onto a second plane, comprising:

a projection lens system interposed between the first and second planes, said projection lens system including a plurality of lens elements arranged at predetermined intervals and defining a plurality of spaces therebetween;

means for shielding at least two spaces, including first and second spaces, of said plurality of spaces from an outer atmosphere, said first space being selected such that variation of a predetermined amount in the pressure of said first space changes a first imaging performance of said projection lens system by a minimum amount relative to other spaces, and said second space being selected such that variation of said predetermined amount in the pressure of said second space changes a second imaging performance by a minimum amount relative to other spaces, one of said first and second imaging performances being the position of an imaging plane and the other being a magnification factor of said projection lens system;

means for measuring variation in temperature of said projection lens system;

means for determining internal pressure of said first space so as to maintain said second imaging performance of said projection lens system in spite of variation in temperature of said projection lens system, and internal pressure of said second space so as to maintain said first imaging performance of said projection lens system in spite of variation in temperature of said projection lens system; and means for controlling the pressure in said first and second spaces independently of each other so that said internal pressures therein coincide with the internal pressures determined by said determining means, respectively.

7. An apparatus according to claim 6 further comprising means for emitting radiation energy that passes through said projection lens system, and wherein said measuring means includes means for monitoring an amount of variation in temperature of said projection lens system caused by said radiation energy.

8. An apparatus according to claim 6, wherein said controlling means includes a first barometric controller provided to control the internal pressure of said first space in accordance with said determining means and a second barometric controller provided to control the internal pressure of said second space in accordance with said determining means.

9. An apparatus for projection of a pattern on a first plane onto a second plane, comprising:

a projection lens system interposed between the first and second planes, said projection lens system including a plurality of lens elements arranged at predetermined intervals and defining a plurality of spaces therebetween;

means for shielding at least two spaces of said plurality of spaces from an outer atmosphere, the shielded spaces comprising a first space group including one of said two spaces and a second space group including the other of said two spaces;

said first space group being selected such that, in the absence of the shielding of said first space group from the outer atmosphere, a first imaging performance of said projection lens system changes in one direction in accordance with variation of the pressure in said first space group with barometric pressure of the atmosphere, and said second space group being selected such that, in the absence of the shielding of said second space group from the outer atmosphere, said first imaging performances of said projection lens system changes in an opposite direction in accordance with variation of the pressure in said second space group with barometric pressure of the atmosphere;

means for communicating the spaces of the first group with each other and for communicating the spaces of the second group with each other;

means for measuring variation in barometric pressure of the outer atmosphere;

means for determining internal pressure of said shielded spaces so as to maintain a second imaging performance of said projection lens system in spite of variation in barometric pressure of the outer atmosphere;

one of said first and second imaging performances being the position of an imaging plane and the other being a magnification factor of said projection lens system; and means for controlling the pressure in said shielded spaces so that said internal pressure therein coincide with the internal pressures determined by said determining means.

10. An apparatus for projection of a pattern on a first plane onto a second plane, comprising:

a projection lens system interposed between the first and second planes, said projection lens system including a plurality of lens elements arranged at predetermined intervals and defining a plurality of spaces therebetween;

means for shielding at least one space of said plurality of spaces from an outer atmosphere;

said at least one space being selected such that a first imaging performance of said projections lens system changes with variation of a refractive index in said at least one space, and a second imaging performance of said projection lens system is substantially constant in spite of variation of the refractive index in said at least one space, one of said first and second imaging performances being the position of an imaging plane and the other being a magnification factor of said projection lens system;

means for measuring variation in barometric pressure of the outer atmosphere;

means for determining the refractive index in said at least one space so as to maintain said first imaging performance in spite of variation in barometric pressure of the outer atmosphere; and means for controlling the refractive index in said at least one space in accordance with said determining means.

11. An apparatus according to claim 10 further comprising means for shielding at least another space of said plurality of spaces from the outer atmosphere, said at least another space being selected such that said first imaging performance is substantially constant in spite of variation of the refractive index in said at least another space, and said second imaging performance changes with variation of a refractive index in said at least another space, and wherein said determining means further determines the refractive index in said at least another space so as to maintain said second imaging performance in spite of variation in barometric pressure of the outer atmosphere and said control means controls the refractive index in said at least another space in accordance with said determining means.

12. An apparatus according to claim 10, wherein said control means controls the pressure in said at least one space in accordance with the determined refractive index.

13. An apparatus for the projection of a pattern of a first plane onto a second plane, comprising:

a projection lens system interposed between the first and second planes, said projection lens system including a plurality of lens elements arranged at predetermined intervals and defining a plurality of spaces therebetween;

means for emitting radiation energy that passes through said projection lens system;

means for shielding at least one space of said plurality of spaces from an outer atmosphere;

said at least one space being selected such that a first imaging performance of said projection lens system changes with variation of a refractive index in said at least one space, and a second imaging performance of said projection lens system is substantially constant in spite of variation of the refractive index in said at least one space, one of said first and second imaging performances being the position of an imaging plane and the other being a magnification factor of said performance lens system;

means for monitoring an amount of variation in temperature of said projection lens system caused by said radiation energy;

means for determining the refractive index in said at least one space so as to maintain said first imaging performance of said projection lens system in spite of variation in temperature of said projection lens system; and means for controlling the refractive index in said at least one space in accordance with said determining means.

14. An apparatus according to claim 13 further comprising means for shielding at least another space of said plurality of spaces from the outer atmosphere, said at least another space being selected such that said first imaging performance is substantially constant in spite of variation of the refractive index in said at least another space, and said second imaging performances changes with variation of a refractive index in said at least another space, and wherein said determining means further determines the refractive index in said at least another space so as to maintain said second imaging performance in spite of variation in temperature of said projection lens system and said control means controls the refractive index in said at least another space in accordance with said determining means.

15. An apparatus according to claim 13, wherein said control means controls the pressure in said at least one space in accordance with the determined refractive index.

16. In a projection lens apparatus provided with a projection lens system including a plurality of lens elements arranged at predetermined intervals and defining a plurality of spaces therebetween, said projection lens system having first and second imaging performances changing in accordance with variation in barometric pressure of an outer atmosphere, one of said first and second imaging performances being the position of an imaging plane and the other being a manifestation factor of said projection lens system, the improvement comprising:

means for shielding at least one space of said plurality of spaces from the outer atmosphere;

said at least one space being selected such that the ratio of the change in said first imaging performance to the change in said second imaging performance which are caused by variation of a refractive index in said at least one space is substantially equal to the ratio of the change in said first imaging performance to the change in said second imaging performance which are caused by variation of a refractive index in remaining spaces except for said at least one space in accordance with variation in barometric pressure of the outer atmosphere;

means for measuring variation in barometric pressure of the outer atmosphere;

means for determining the refractive index in said at least one space so as to maintain said first and second imaging performance in spite of variation in barometric pressure of the outer atmosphere; and means for controlling the refractive index in said at least one space in accordance with said determining means.

17. The improvement according to claim 16, wherein said controlling means controls the pressure in said at least one space so as to provide a predetermined refractive index.

18. In a projection lens apparatus provided with a projection lens system including a plurality of lens elements arranged at predetermined intervals and defining a plurality of spaces therebetween and with means for emitting radiation energy that pass through said projection lens system, said projection lens system having first and second imaging performances changing in accordance with variation in temperature of said projection lens system, one of said first and second imaging performances being the position of an imaging plane and the other being a magnification factor of said projection lens system, the improvement comprising:

means for shielding at least one space of said plurality of spaces from the outer atmosphere;

said at least one space being selected such that the ratio of the change in said first imaging performance to the change in said second imaging performance which are caused by variation of a refractive index in said at least one space is substantially equal to the ratio of the change in said first imaging performance to the change in said second imaging performance which are caused by variation in temperature of said projection lens system;

means for monitoring an amount of variation in temperature of said projection lens system caused by said radiation energy;

means for determining the refractive index in said at least one space so as to maintain said first and second imaging performances in spite of variation in temperature of said projection lens system; and means for controlling the refractive index in said at least one space in accordance with said determining means.

19. The improvement according to claim 18, wherein said control means controls the pressure in said at least one space so as to provide a predetermined refractive index.

* * * * *